United States Patent
El Baraji et al.

(10) Patent No.: US 8,441,844 B2
(45) Date of Patent: May 14, 2013

(54) METHOD FOR WRITING IN A MRAM-BASED MEMORY DEVICE WITH REDUCED POWER CONSUMPTION

(75) Inventors: Mourad El Baraji, Sunnyvale, CA (US); Neal Berger, Cupertino, CA (US)

(73) Assignee: Crocus Technology SA, Grenoble Cedex (FR)

( * ) Notice: Subject to any disclaimer, the term of this patent is extended or adjusted under 35 U.S.C. 154(b) by 183 days.

(21) Appl. No.: 13/155,669

(22) Filed: Jun. 8, 2011

(65) Prior Publication Data

US 2012/0008380 A1    Jan. 12, 2012

(30) Foreign Application Priority Data

Jul. 7, 2010  (EP) .................................... 10168737

(51) Int. Cl.
 *G11C 11/00*  (2006.01)
(52) U.S. Cl.
 USPC ............ 365/158; 365/148; 365/171; 977/935
(58) Field of Classification Search ..................... 365/48, 365/55, 62, 66, 74, 78, 80–93, 100, 130, 365/131, 148, 158, 171–173, 209, 213, 225.5, 365/230.07, 232, 243.5; 216/22; 257/295, 257/421, 422, 427, E21.665, E27.006; 438/3; 428/810–816, 817–825.1, 826; 977/933–935
See application file for complete search history.

(56) References Cited

U.S. PATENT DOCUMENTS

2009/0180315 A1  7/2009  Yoon et al.
2011/0216580 A1*  9/2011  Berger et al. ................. 365/158

FOREIGN PATENT DOCUMENTS

EP   2109111 A1   10/2009
WO  2008109768 A1   9/2008

OTHER PUBLICATIONS

European Search Report for EP10168737 dated Oct. 18, 2010.

* cited by examiner

*Primary Examiner* — Harry W Byrne
(74) *Attorney, Agent, or Firm* — Pearne & Gordon LLP

(57) ABSTRACT

A method of writing in a memory device comprising a plurality of MRAM cells, each cell including a magnetic tunnel junction having a resistance that can be varied during a write operation when heated at a high threshold temperature; a plurality of word lines connecting cells along a row; and a plurality of bit lines connecting cells along a column; the method comprising supplying a bit line voltage to one of the bit lines and a word line voltage to one of the word lines for passing a heating current through the magnetic tunnel junction of a selected cell; said word line voltage is a word line overdrive voltage being higher than the core operating voltage of the cells such that the heating current has a magnitude that is high enough for heating the magnetic tunnel junction at the predetermined high threshold temperature. The memory device can be written with low power consumption.

8 Claims, 3 Drawing Sheets

METHOD FOR WRITING IN A MRAM-BASED MEMORY DEVICE WITH REDUCED POWER CONSUMPTION

FIELD

The present disclosure relates to a method of writing in a memory device comprising a plurality of magnetoresistive random access memory (MRAM) cells allowing for reduced power consumption.

BACKGROUND

A conventional memory device based on magnetic random access memory (MRAM) cells is shown schematically in FIG. 1. The memory device 10 typically includes an array of word lines WL and bit lines BL that intersects to form an array. A MRAM cell 1 is coupled at each intersection of the word lines WL and bit lines BL. Each MRAM cell 1 comprises a magnetic tunnel junction 2, represented by a resistance, electrically coupled at one end to a select CMOS transistor 3. The magnetic tunnel junction 2 is typically formed to form an insulating layer in-between a reference layer and a storage layer (these element are not shown in FIG. 1). The word lines WL connect the MRAM cells 1 along a row via the gate of their respective transistors 3, while the bit lines BL connect the MRAM cells 1 along a column via the other end of their respective magnetic tunnel junction 2.

One of the MRAM cells 1, located at a corresponding intersection of one of the bit and word lines BL, WL, can be selected by providing the corresponding bit and word lines with a predetermined bias voltage value. In the example of FIG. 1, a selection circuitry 4 allows for selecting the bit and word lines BL, WL being supplied with the bias voltage.

During a so-called thermally assisted switching (TAS) writing operation of the selected MRAM cell 1, data is written by applying a single heating current pulse $I_{heat}$ through the magnetic tunnel junction 2 in order to heat it above a predetermined high threshold temperature, while a magnetic field or a spin polarized current is applied to switch the magnetization of the storage layer. The MRAM cell 1 is then cooled down by switching off the heating current pulse $I_{heat}$, thereby freezing the magnetization of the storage layer in the written direction.

The data is then read by measuring the resistance magnetic tunnel junction, or magnetoresistance, by applying a sense voltage across the magnetic tunnel junction, at ambient temperature, or by passing a sense current through the magnetic tunnel junction and reading the resultant voltage.

One of the major drawbacks of this writing procedure is the necessary heating current $I_{heat}$ to raise the temperature of the storage layer above its threshold temperature. Indeed, during the writing operation, the heating current is controlled by the bias voltage applied to both word and bit lines WL, BL. The magnitude of the heating current $I_{heat}$ required to heat the magnetic tunnel junction 2 above the predetermined high threshold temperature imposes a constraint on the conductivity of the select transistor 3, depending on the size of the magnetic tunnel junction 2 in series with the transistor 3. For example, in order to reach a threshold temperature of 150° C. in the magnetic tunnel junction 2 having a surface area of $3.14 \cdot 10^{-2}$ µm², the heating current $I_{heat}$ must have a value of about 200 µA, when using a low size select transistor (for example of 0.13 µm). Here, the heating current $I_{heat}$ is given by Equation 1:

$$I_{heat} = A * \sqrt{\frac{Pd}{RA}}, \quad \text{(Equation 1)}$$

where A is the surface area of the magnetic tunnel junction 2, $P_d$ the current power density in Watts cm⁻², and RA the resistance-area product of the magnetic tunnel junction (insulating layer) in Ωcm².

Since the size of the MRAM cell 1 is generally decreased due to increasing level of integration and scale down, the gate length and the oxide film thickness of the select transistor 3 are reduced. Therefore, a low memory array voltage, or core voltage, is used to power-up the MRAM cell 1, such as to reduce the power consumption and to improve the reliability of the select transistor 3. Indeed, using a high core voltage would produce a high channel electric field, possibly reaching a voltage-resistant limit of the select transistor oxide film, thus degrading the reliability of the select transistor 3.

It is therefore difficult to generate a value of the heating current that is high enough in most MRAM cells 1 by using the low core voltage. For example, in the case the core voltage has a value of 1.2 volts, and a voltage of 1.2 volts is applied to the world line WL and the bit line BL, the resulting heating current $I_{heat}$ flowing through the magnetic tunnel junction 2 has a value of 130 µA. This is insufficient to reach the high threshold temperature of 150° C., and the cell 1 cannot be written.

Patent application WO2008109768 discloses a system, circuit and method for controlling a word line voltage at a word line transistor in spin transfer torque MRAM). A first voltage can be supplied to the word line transistor for write operations. A second voltage, which is less than the first voltage, can be supplied to the word line transistor during read operations. The risk of invalid write during the read operation is minimized.

Patent application EP2109111 discloses a TAS-MRAM cell comprising a magnetic tunnel junction a select transistor and a current line electrically connected to the junction, wherein the current line has a first function for passing a first portion of current for heating the junction, and a second function for passing a second portion of current in order to vary the resistance of the TAS-MRAM cell.

SUMMARY

The present application discloses a method of writing in a memory device comprising a plurality of magnetoresistive random access memory (MRAM) cells which overcome at least some limitations of the prior art.

According to the embodiments, a method of writing in a memory device comprising a plurality of MRAM cells arranged in rows and columns, each MRAM cell including a magnetic tunnel junction having a resistance that can be varied during a write operation when the magnetic tunnel junction is heated at a high threshold temperature, and a select transistor electrically coupled to the magnetic tunnel junction; a plurality of word lines connecting MRAM cells along a row; and a plurality of bit lines connecting MRAM cells along a column; can comprise, during the write operation, supplying a bit line voltage to one of the bit lines and a word line voltage to one of the word lines for passing a heating current through the magnetic tunnel junction of a selected MRAM cell; characterized in that said word line voltage is a word line overdrive voltage being higher than the core operating voltage of the MRAM cells such that the heating current has a magnitude that is high enough for heating the magnetic tunnel junction at the predetermined high threshold temperature.

In an embodiment, the word line overdrive voltage can be a voltage pulse with a pulse duration being equal to or smaller than about 15 ns.

In another embodiment, the word line overdrive voltage can be generated by a charge pump or by a regulable external voltage provided by an input-output port.

In yet an embodiment, the memory device can further comprise a sense amplifier circuitry, and wherein the pulse duration of the word line overdrive voltage can be controlled by the sense amplifier circuitry.

In yet an embodiment, the select transistor can be a high power transistor having a low threshold voltage.

In yet an embodiment, the memory device can further comprise a plurality of source lines connecting MRAM cells along a row, via the drain of their respective select transistor, and wherein the method can further comprise supplying a source line overdrive voltage to the source line.

In yet an embodiment, the source line overdrive voltage can have a value substantially equal to the threshold voltage of the select transistor.

In yet an embodiment, the method can further comprise a read operation including measuring the resistance of the magnetic tunnel junction, and supplying the source line overdrive voltage to the source line.

The disclosed method allows for passing the heating current with a sufficient magnitude such that the magnetic tunnel junction can be heated at a temperature that is high enough to reach a high threshold temperature appropriate for varying its resistance, without increasing the size of the transistors. Indeed, the disclosed method allows for collecting a high heating current density on the transistor drain without increasing the transistor size. The disclosed method allows for using low size transistors and therefore, the memory device can have a high-density and can be written with low power consumption.

BRIEF DESCRIPTION OF THE DRAWINGS

Preferred embodiments will be better understood with the aid of the description of an embodiment given by way of example and illustrated by the figures, in which.

DETAILED DESCRIPTION OF POSSIBLE EMBODIMENTS

Figure 1:
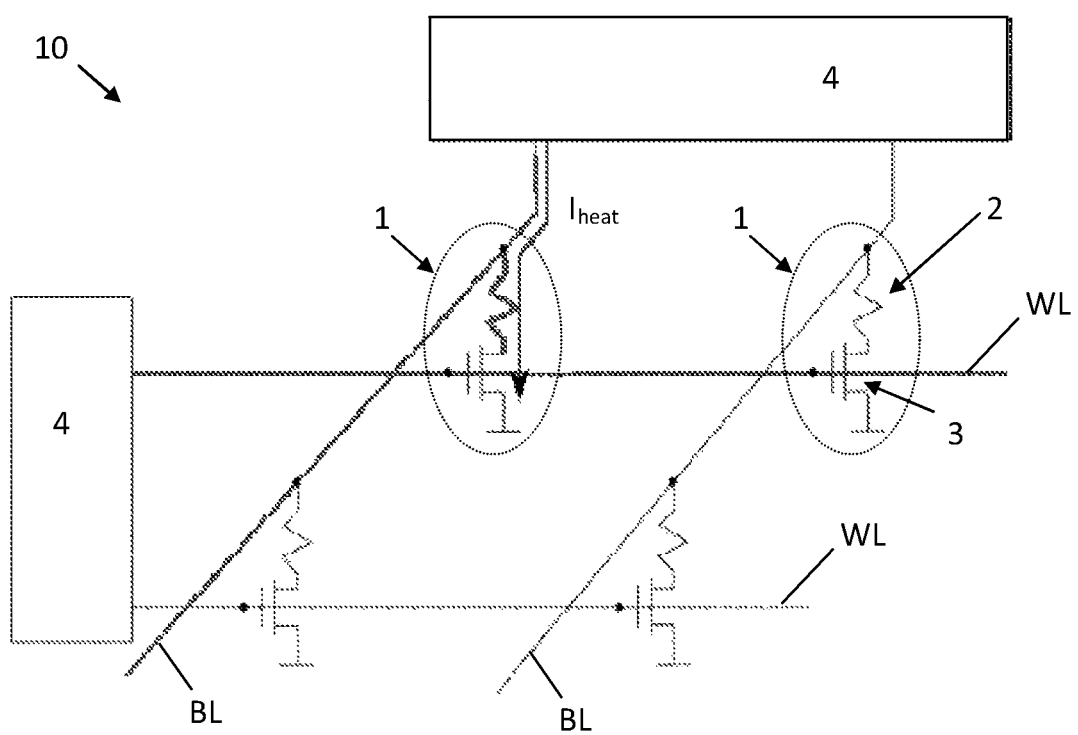
FIG. 1 shows schematically a conventional memory device based on magnetic random access memory (MRAM) cells.
Figure 2:
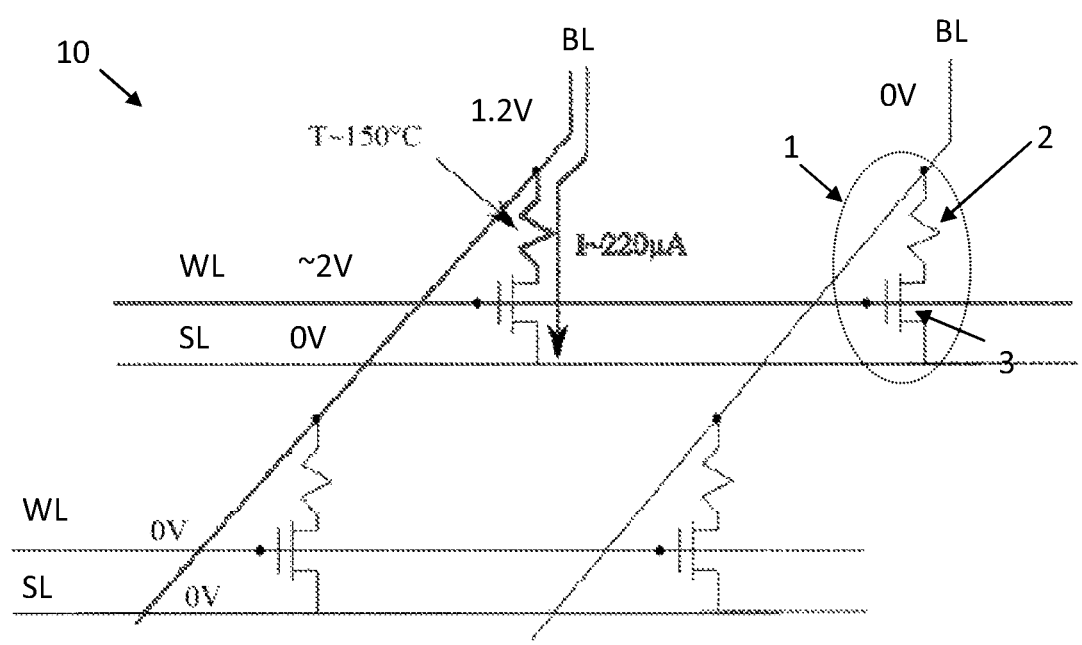
FIG. 2 represents a memory device according to an embodiment.

FIG. 2 represents schematically a memory device 10 according to a preferred embodiment. The memory device 10 comprises a plurality of magnetoresistive random access memory (MRAM) cells 1 arranged in rows and columns. Four of such MRAM cells 1 are shown in FIG. 2. Each MRAM cell 1 comprises a magnetic tunnel junction 2, represented by a resistance in FIG. 1, electrically coupled at one end to a select CMOS transistor 3. Although not represented in FIG. 2, the magnetic tunnel junction 2 can be formed of a reference layer having a fixed magnetization, a storage layer having a magnetization direction that can be switched from a first stable direction to a second stable direction upon writing of the cell, and an insulating layer between the storage layer and the sense layer. The MRAM cell 1 can be written by using a thermally-assisted switching (TAS) write operation. Such TAS write operation requires heating the magnetic tunnel junction 2 at a high threshold temperature in order to switch the magnetization of the storage layer and then cool the magnetic tunnel junction 2 at a low threshold temperature, below the high threshold temperature, in order to freeze the magnetization of the storage layer in the written state. In other words, the magnetic tunnel junction 2 has a resistance which value can be changed during the TAS write operation 2 when heating the magnetic tunnel junction 2 at the high threshold temperature.

The memory device 10 comprises a plurality of bit lines BL and word lines WL forming an angle, preferably orthogonal, with the bit lines BL. The bit lines BL connect the MRAM cells 1 along a column, via the other end of their magnetic tunnel junction 2, and the word lines WL connect the MRAM cells 1 along a row via the gate of their select transistor 3. The memory device 10 further comprises a plurality of source lines SL arranged substantially orthogonal with the bit lines BL, each source line SL connecting the MRAM cells 1 along a row, via the drain of their respective select transistor 3.

During the write operation, data is written in one of the MRAM cells 1 by supplying a bit line voltage $V_{BL}$, to one of the bit lines BL, and supplying a word line voltage $V_{WL}$ to one of the word lines WL. The MRAM cell 1 being written, or the selected MRAM cell 1, is the cell 1 addressed by the bit and word lines BL, WL being supplied by the respective bit line and word line voltages $V_{BL}$ and $V_{WL}$. The value of the voltages $V_{BL}$ and $V_{WL}$ usually correspond to a maximum supply voltage $V_{DD}$, or core voltage that is determined by the specifications of the select transistor 3, and enable passing a heating current $I_{heat}$ through the magnetic tunnel junction 1 of the selected MRAM cell 1. As discussed above, in the case the select transistor 3 has a size of 0.13 μm, the core voltage, or gate-to-source voltage $V_{GS}$ of the select transistor 3, has a value typically of 1.2 V.

According to the embodiment of FIG. 2, during the write operation the word line voltage $V_{WL}$ supplied to one of the word lines WL corresponds to a word line overdrive voltage $V_{WLo}$ that is higher than a core operating voltage of the MRAM cell 1, during a writing period of the write operation. The value of the word line overdrive voltage $V_{WLo}$ is determined such that the select transistor 3 drives the heating current $I_{heat}$ having a magnitude that is high enough for heating the magnetic tunnel junction 2 at the high threshold temperature. More particularly, the value of the word line overdrive voltage $V_{WLo}$ is determined taking into account the size and density of the MRAM cells 1 and the foundry design rules for oxide stress of the magnetic tunnel junction 2 such as to avoid impacting on the reliability of the memory device 10. The word line overdrive voltage $V_{WLo}$ can be generated by an internal charge pump (not shown), or from a regulable external voltage $V_{DD}$ being higher than the core operating voltage and provided by an input-output port IO (also not shown). In the example of FIG. 2, the word line overdrive voltage $V_{WLo}$ having a magnitude of 2 V allows passing the heating current $I_{heat}$ with a magnitude of 220 μA in the case the magnetic tunnel junction 2 of the MRAM cell 1 has a diameter of 100 nm and a resistance-area product (RA) of about 30 Ωcm².

Once the magnetic tunnel junction 2 has reached the high threshold temperature, its resistance can be varied, for example, by applying a magnetic field to the magnetic tunnel junction 2 or by passing a spin polarized current through the magnetic tunnel junction 2. In the case the magnetic tunnel junction 2 comprises the reference layer and the storage layer, the magnetic tunnel junction resistance can be varied by adjusting the magnetization direction of the storage layer. Here, for example, a high resistance is measured when the magnetization direction of the storage layer is substantially opposed to the one of the reference layer, and a low resistance is measure when the respective magnetizations of the storage and reference layers are oriented substantially in the same direction. The selected MRAM cell 1 is then cooled down by switching off the heating current pulse $I_{heat}$, thereby freezing the magnetic tunnel junction resistance in its written value, for example, by freezing the magnetization of the storage layer in the written direction.

In a variant of the embodiment, the word line overdrive voltage $V_{WLo}$ is a voltage pulse which duration, or width, can be controlled such as to avoid possible stress on the gate oxide of the select transistor 3. This can be especially important in the case the MRAM cell is manually written by a user. The control of the voltage pulse can be performed, for example, using internal timers (not shown). Here, the word line overdrive voltage $V_{WLo}$ has a voltage pulse duration typically around 15 ns or smaller.

The memory device 10 can further comprise a sense amplifier circuitry (not shown) used to latch the correct state of the MRAM cell 1, and hold the input-output IO in this state until a new address is selected, corresponding to selecting another MRAM cell 1. In that case, the control of the word line overdrive voltage pulse $V_{WLo}$ must be timed with the sense amplifier circuitry, or the word line overdrive voltage $V_{WLo}$ pulse duration is controlled by the sense amplifier circuitry.

In another embodiment not represented, the select transistor 3 is a high power HP transistor having a low threshold voltage $V_{th}$. Such HP transistor can drive more current than standard CMOS transistors for a given gate voltage. However, a drawback of HP transistors is their large OFF-state current $I_{off}$ when the gate-to-source voltage $V_{GS}$ is zero. High $I_{off}$ leakage of the bit line BL can limit the number of MRAM cells 1 which can be connected to one segment of bit line BL, since this $I_{off}$ leakage can possibly degrade the sense amplifier margins to unacceptable levels. Typically higher sensing margin is obtained for a smaller leakage current. Using several small segments of bit lines BL is not advantageous since this requires using several bit line segmentation transistors (not shown) that are typically quite large and costly to implement.

In a variant of the embodiment, the OFF-state current $I_{off}$ leakage is reduced by using a negative gate driving scheme. Reducing the $I_{off}$ leakage thus allows connecting more MRAM cells per segment of bit line BL and, consequently, a denser memory device 10 and lower costs, since less segmentation transistors are needed.

Figure 3:
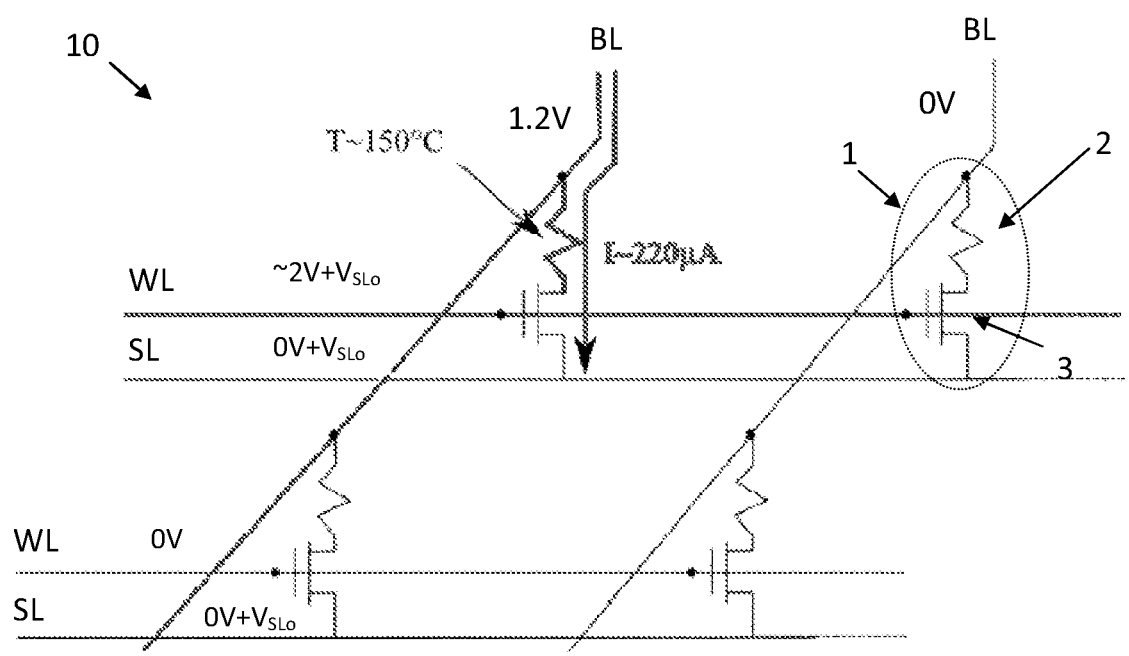
FIG. 3 represents the memory device according to another embodiment.

FIG. 3 represents yet another embodiment of the memory device 10 where the select transistors 3 can be HP transistors. In the embodiment of FIG. 3, a source line overdrive voltage $V_{SLo}$ is supplied to the source line SL in order to reduce the leakage current $I_{off}$. Here, the source line overdrive voltage $V_{SLo}$ can have a value equal or close to the value of the threshold voltage $V_{th}$ of the select transistor 3.

During a read operation, data written in the selected MRAM cell 1 is read by measuring the magnetic tunnel junction resistance of the cell 1. This can be performed by applying a sense voltage (not shown) across the magnetic tunnel junction 2, at ambient temperature, or by passing a sense current (also not shown) through the magnetic tunnel junction 2 and reading the resultant voltage.

In an embodiment, the power consumption of the memory device 10 can be minimized by supplying the same source line overdrive voltage $V_{SLo}$ to the source lines SL during the read operation as during the write operation. During the write operation, the gate of the select transistors 3 can then be over-driven by applying the word line overdrive voltage $V_{WLo}$ to the world lines WL, such that the heating current $I_{heat}$ flowing through the magnetic tunnel junction 2 has a magnitude high enough for heating the magnetic tunnel junction 2 above the predetermined high threshold temperature. The above method allows for using low size transistors (3) and therefore, the memory device can have a high-density and can be written with low power consumption.

REFERENCE NUMBERS AND SYMBOLS

| | |
|---|---|
| 1 | MRAM cell |
| 2 | magnetic tunnel junction |
| 3 | select transistor |
| 4 | selection circuitry |
| 10 | memory device |
| BL | bit line |
| HP | high power |
| $I_{heat}$ | heating current |
| $I_{off}$ | OFF-state current |
| SL | source line |
| $V_c$ | core voltage |
| $V_{DD}$ | drain-drain voltage |
| $V_{GS}$ | gate-to-source voltage |
| $V_{SLo}$ | source line overdrive voltage |
| $V_{WLo}$ | word line overdrive voltage |
| $V_{th}$ | threshold voltage |
| WL | word line |

The invention claimed is:

1. A method of writing in a memory device comprising a plurality of magnetoresistive random access memory (MRAM) cells arranged in rows and columns, each MRAM cell to be written by using a thermally-assisted switching (TAS) write operation, including a magnetic tunnel junction having a resistance that can be varied during a write operation when the magnetic tunnel junction is heated at a high threshold temperature, and a select transistor electrically coupled to the magnetic tunnel junction; a plurality of word lines connecting MRAM cells along a row; and a plurality of bit lines connecting MRAM cells along a column; comprising, during the write operation:
    supplying a bit line voltage to one of the bit lines and a word line voltage to one of the word lines for passing a heating current through the magnetic tunnel junction of a selected MRAM cell;
    once the magnetic tunnel junction has reached the high threshold temperature, varying the resistance of the magnetic tunnel junction; and
    cooling the magnetic tunnel junction such as to freeze said resistance in its written value;
    said word line voltage is a word line overdrive voltage being higher than the core operating voltage of the MRAM cells such that the heating current has a magnitude that is high enough for heating the magnetic tunnel junction at the predetermined high threshold temperature.

2. The method according to claim 1, wherein the word line overdrive voltage is a voltage pulse with a pulse duration being equal to or smaller than about 15 ns.

3. The method according to claim 1, wherein the word line overdrive voltage is generated by a charge pump or by a regulable external voltage provided by an input-output port.

4. The method according to claim 1, wherein the memory device further comprises a sense amplifier circuitry, and wherein the pulse duration of the word line overdrive voltage is controlled by the sense amplifier circuitry.

5. The method according to claim 1, wherein the select transistor is a high power transistor having a low threshold voltage.

6. The method according to claim 1, wherein the memory device further comprises a plurality of source lines connecting MRAM cells along a row, via the drain of their respective select transistor, and wherein the method further comprises supplying a source line overdrive voltage to the source line.

7. The method according to claim 6, wherein the source line overdrive voltage has a value substantially equal to the threshold voltage of the select transistor.

8. The method according to claim 6, further comprising a read operation including measuring the resistance of the magnetic tunnel junction, and supplying the source line overdrive voltage to the source line.

* * * * *